United States Patent
Saito et al.

(10) Patent No.: US 10,588,249 B2
(45) Date of Patent: Mar. 10, 2020

(54) ELECTROMAGNETIC WAVE ABSORBING BODY AND METHOD FOR MANUFACTURING ELECTROMAGNETIC WAVE ABSORBING BODY

(71) Applicant: DAIDO STEEL CO., LTD., Nagoya-shi (JP)

(72) Inventors: Akihiko Saito, Nagoya (JP); Yu Nakama, Nagoya (JP); Mikiko Tsutsui, Nagoya (JP); Tadashi Hattori, Nagoya (JP)

(73) Assignee: DAIDO STEEL CO., LTD., Nagoya-Shi, Aichi (JP)

( * ) Notice: Subject to any disclaimer, the term of this patent is extended or adjusted under 35 U.S.C. 154(b) by 0 days.

(21) Appl. No.: 15/716,390

(22) Filed: Sep. 26, 2017

(65) Prior Publication Data
US 2018/0103564 A1    Apr. 12, 2018

(30) Foreign Application Priority Data

Oct. 11, 2016    (JP) ................................. 2016-199746

(51) Int. Cl.
*H05K 9/00*    (2006.01)

(52) U.S. Cl.
CPC ........... *H05K 9/0083* (2013.01); *H05K 9/006* (2013.01)

(58) Field of Classification Search
CPC .... H05K 9/006; H05K 9/0081; H05K 9/0073; H05K 9/009; H05K 9/0056
See application file for complete search history.

(56) References Cited

U.S. PATENT DOCUMENTS

| 6,727,781 B2 | 4/2004 | Saito |
| 9,144,185 B1 | 9/2015 | Hansen et al. |
(Continued)

FOREIGN PATENT DOCUMENTS

| CN | 1577635 A | 2/2005 |
| JP | 2001-189585 A | 7/2001 |
(Continued)

OTHER PUBLICATIONS

Korean Office Action, dated Jun. 29, 2018, in Korean Patent Application No. 10-2017-0131042 and Enalish Translation thereof.
(Continued)

*Primary Examiner* — Frank J Vineis
*Assistant Examiner* — Alicia J Sawdon
(74) *Attorney, Agent, or Firm* — McGinn I.P. Law Group, PLLC.

(57) ABSTRACT

The present invention relates to an electromagnetic wave absorbing body which is a sheet-like electromagnetic wave absorbing body in which particles including a soft magnetic material are dispersed in a matrix including a non-metal material, in which the electromagnetic wave absorbing body satisfies a relationship: $\alpha \geq \frac{1}{5}$, in which $\alpha$ is a parameter given by Equation (1): $\alpha = Ad(\varepsilon\mu)^{0.5}/(\mu''+\varepsilon''\mu/\varepsilon)$, in which d is a thickness of the electromagnetic wave absorbing body, $\varepsilon$, $\varepsilon''$, $\mu$, and $\mu''$ are a permittivity of the electromagnetic wave absorbing body, a loss term of $\varepsilon$, a permeability of the electromagnetic wave absorbing body, and a loss term of $\mu$, respectively, and A is equal to $8\times10^4/\pi(\Omega/m)$.

5 Claims, 5 Drawing Sheets

(56) References Cited

U.S. PATENT DOCUMENTS

| | | |
|---|---|---|
| 2002/0079115 A1 | 6/2002 | Saito |
| 2005/0030217 A1 | 2/2005 | Saito et al. |
| 2013/0063296 A1* | 3/2013 | Hennig ................ H01Q 1/245 |
| | | 342/1 |
| 2013/0202865 A1 | 8/2013 | Choi et al. |
| 2013/0224023 A1 | 8/2013 | Kim et al. |

FOREIGN PATENT DOCUMENTS

| | | | | |
|---|---|---|---|---|
| JP | 2001-189586 A | | 7/2001 | |
| JP | 2001189585 A | * | 7/2001 | ............... H01F 1/28 |
| JP | 2002-164687 A | | 6/2002 | |
| JP | 2002-271084 A | | 9/2002 | |
| KR | 2009-0089277 A | | 8/2009 | |

OTHER PUBLICATIONS

Chinese Office Action, dated Feb. 27, 2019, in Chinese Application No. 201710943194.2 and English Translation thereof.
Japanese Office Action, dated Jul. 31, 2019, in Japanese Application No. 2016-199746 and English Translation thereof.

* cited by examiner

ELECTROMAGNETIC WAVE ABSORBING BODY AND METHOD FOR MANUFACTURING ELECTROMAGNETIC WAVE ABSORBING BODY

FIELD OF THE INVENTION

The present invention relates to an electromagnetic wave absorbing body and, more particularly, relates to a sheet-like electromagnetic wave absorbing body that is provided in high frequency communication devices etc. and absorbs electromagnetic waves, as well as a manufacturing method thereof.

BACKGROUND OF THE INVENTION

In high frequency communication devices that are equipped with a processing circuit for processing an input signal and outputting a resulting signal, in general, the processing circuit is housed in a metal case to prevent influence of external electromagnetic waves on a signal being processed and leakage of electromagnetic waves to the outside from the high frequency communication device. In this case, there is a problem that propagation and resonance of electromagnetic waves in the case cause coupling (electromagnetic coupling) between an input signal and an output signal. The metal material of the walls of the case is a factor in accelerating such coupling. This problem is now particularly remarkable because of increase of communication frequencies.

In high frequency communication devices, it is known to provide an internal surface of a case with a sheet-like electromagnetic wave absorbing body as a means of reducing the degree of coupling between signals in circuits such as an input signal and an output signal. An example of electromagnetic wave absorbing bodies of that kind is one in which particles including a soft magnetic material are dispersed in a matrix including a resin material, or the like.

For example, Patent Document 1 discloses a technique that is employed in a high frequency amplifier in which an amplification device is housed in a metal case and lead wires are connected to the input side and the output side of the amplification device. Electromagnetic coupling between the input side and the output side is prevented by providing an electromagnetic wave absorbing body inside and adjacent to at least one of the pair of side walls, the ceiling, and the pair of end walls of the case. Patent Document 1 discloses, as an example of the electromagnetic wave absorbing body, one obtained by mixing an Fe-7Cr-9Al powder made of a soft metal into polyethylene chloride rubber at 15 to 45 vol % and rolling a resulting mixture into a sheet having a thickness of 0.5 to 1.5 mm.

Patent Document 1: JP-A-2002-164687

SUMMARY OF THE INVENTION

Conventionally, electromagnetic wave absorbing bodies for communication devices are designed according to a guideline that electromagnetic wave absorption energy absorbed by the electromagnetic wave absorbing body (see Equation (3) shown later) should be made large. As described in Patent Document 1, in the case of using a material in which particles including a soft magnetic material are dispersed in a matrix, the absorption energy absorbed by an electromagnetic wave absorbing body, which is determined by the material itself of the electromagnetic wave absorbing body, depends on the compositions of the particles and the matrix and the diameter, shape, content (filling factor), etc. of the particles.

However, according to the knowledge of the present inventors, there may occur a case that even an electromagnetic wave absorbing body that is formed using a material capable of absorbing a large amount of energy cannot be used effectively to attenuate electromagnetic waves in a high frequency communication device, depending on, for example, the thickness of the electromagnetic wave absorbing body. That is, the absorption energy of an electromagnetic wave absorbing body is not necessarily a good index in designing an electromagnetic wave absorbing body to be used for attenuating electromagnetic waves.

An object of the present invention is to provide an electromagnetic wave absorbing body that is highly effective in attenuating electromagnetic waves in a high frequency communication device, as well as a manufacturing method that enables designing and manufacture of such an electromagnetic wave absorbing body.

Namely, the present invention relates to the following items (1) to (10).

(1) An electromagnetic wave absorbing body which is a sheet-like electromagnetic wave absorbing body in which particles including a soft magnetic material are dispersed in a matrix including a non-metal material, wherein the electromagnetic wave absorbing body satisfies a relationship: $\alpha \geq \frac{1}{5}$, in which $\alpha$ is a parameter given by Equation (1):

$$\alpha = Ad(\varepsilon\mu)^{0.5}/(\mu'' + \varepsilon''\mu/\varepsilon) \tag{1}$$

in which d is a thickness of the electromagnetic wave absorbing body, $\varepsilon$, $\varepsilon''$, $\mu$, and $\mu''$ are a permittivity of the electromagnetic wave absorbing body, a loss term of $\varepsilon$, a permeability of the electromagnetic wave absorbing body, and a loss term of $\mu$, respectively, and A is equal to $8 \times 10^4/\pi (\Omega/m)$.

(2) The electromagnetic wave absorbing body according to (1), in which $\alpha$ satisfies a relationship: $m + \frac{1}{5} \leq \alpha \leq m + \frac{4}{5}$, in which m is an integer that is larger than or equal to 0.

(3) The electromagnetic wave absorbing body according to (2), in which m is equal to 0.

(4) The electromagnetic wave absorbing body according to any one of (1) to (3), in which the thickness d of the electromagnetic wave absorbing body is larger than or equal to 1 μm and smaller than or equal to 20 mm.

(5) The electromagnetic wave absorbing body according to any one of (1) to (4), in which the particles including the soft magnetic material are contained in an amount of 30 vol % or more in the electromagnetic wave absorbing body.

(6) The electromagnetic wave absorbing body according to any one of (1) to (5), in which the electromagnetic wave absorbing body is used for attenuating electromagnetic waves whose frequency is higher than or equal to 1 GHz and lower than or equal to 100 GHz.

(7) A method for manufacturing an electromagnetic wave absorbing body which is a sheet-like electromagnetic wave absorbing body in which particles including a soft magnetic material are dispersed in a matrix including a non-metal material, the method including:

designing the electromagnetic wave absorbing body so as to satisfy a relationship: $\alpha \geq \frac{1}{2} - \Delta$, in which $\alpha$ is a parameter given by Equation (1):

$$\alpha = Ad(\varepsilon\mu)^{0.5}/(\mu'' + \varepsilon''\mu/\varepsilon) \tag{1}$$

in which d is a thickness of the electromagnetic wave absorbing body, $\varepsilon$, $\varepsilon''$, $\mu$, and $\mu''$ are a permittivity of the electromagnetic wave absorbing body, a loss term of ε, a permeability of the electromagnetic wave absorbing body, and a loss term of μ, respectively, and A and Δ are constants that are set according to a desired electromagnetic wave attenuation factor.

(8) The method for manufacturing an electromagnetic wave absorbing body according to (7), in which the electromagnetic wave absorbing body is designed so that α satisfies a relationship: $m+½-Δ≤α≤m+½+Δ$, in which m is an integer that is larger than or equal to 0.

(9) The method for manufacturing an electromagnetic wave absorbing body according to (8), in which m is equal to 0.

(10) The method for manufacturing an electromagnetic wave absorbing body according to any one of (7) to (9), in which A is equal to $8×10^4/π(Ω/m)$, and Δ is equal to $3/10$.

In the electromagnetic wave absorbing body according to the present invention, parameter α that is calculated according to Equation (1) satisfies the relationship: $α≥⅕$. Equation (1) and Inequality $α≥⅕$ are formulae that are derived taking into consideration not only the electromagnetic wave absorption energy absorbed by the electromagnetic wave absorbing body but also the interference between electromagnetic waves reflected from the surface of the electromagnetic wave absorbing body and electromagnetic waves reflected after entrance into the electromagnetic wave absorbing body. This makes it possible to manufacture an electromagnetic wave absorbing body capable of attenuating electromagnetic waves with high efficiency through a design procedure that involves the thickness of the electromagnetic wave absorbing body and the interference condition that varies according to the application frequency.

In the case where parameter α satisfies the relationship: $m+⅕≤α≤m+⅘$, in which m is an integer that is larger than or equal to 0, a thickness d of the electromagnetic wave absorbing body and an application frequency are set taking into consideration not only a case that electromagnetic waves reflected after entrance into the electromagnetic wave absorbing body interfere with electromagnetic waves reflected from the surface of the electromagnetic wave absorbing body with a phase difference within one wavelength but also a case that electromagnetic waves reflected after entrance into the electromagnetic wave absorbing body interfere with electromagnetic waves reflected from the surface of the electromagnetic wave absorbing body with a phase difference that is larger than one wavelength, and also taking into consideration both of influence of interference that may occur in an electromagnetic wave absorbing body that is thin relative to the wavelength of electromagnetic waves and influence of interference that may occur in an electromagnetic wave absorbing body that is thick relative to the wavelength of electromagnetic waves. As a result, an electromagnetic wave absorbing body that exhibits high electromagnetic wave attenuation efficiency can be manufactured easily even under such conditions that interference with a phase difference that is larger than one wavelength tends to occur.

In the case where parameter m is equal to 0, an electromagnetic wave absorbing body can be manufactured with consideration given to both of influence of interference that may occur in a thin electromagnetic wave absorbing body and influence of interference that may occur in a thick electromagnetic wave absorbing body in the case that electromagnetic waves reflected after entrance into the electromagnetic wave absorbing body interfere with electromagnetic waves reflected from the surface of the electromagnetic wave absorbing body with a phase difference within one wavelength. As a result, an electromagnetic wave absorbing body that exhibits high electromagnetic wave attenuation efficiency can be manufactured though its thickness d is small.

In the case where the thickness d of the electromagnetic wave absorbing body is larger than or equal to 1 μm and smaller than or equal to 20 mm, the electromagnetic wave absorbing body can exhibit a sufficient electromagnetic wave attenuation effect and can easily be installed, as a sheet body, to a case or the like of a high frequency communication device.

In the case where the particles including the soft magnetic material are contained in an amount of 30 vol % or more in the electromagnetic wave absorbing body, high electromagnetic wave attenuation efficiency can be obtained easily.

In the case where the electromagnetic wave absorbing body is used for attenuating electromagnetic waves whose frequency is higher than or equal to 1 GHz and lower than or equal to 100 GHz, a good correspondence is obtained between the electromagnetic wave attenuation efficiency and the range $α≥⅕$ or $m+⅕≤α≤m+⅘$ that is set for parameter α calculated according to Equation (1). Furthermore, this measure makes it possible to use the electromagnetic wave absorbing body suitably in various high frequency communication devices.

In the method for manufacturing an electromagnetic wave absorbing body according to the present invention, an electromagnetic wave absorbing body that exhibits a desired electromagnetic wave attenuation factor can be manufactured by selecting materials and setting a thickness d etc. using, as a reference, parameter α calculated according to Equation (1) so as to satisfy the relationship: $α≥½-Δ$. Equation (1) and Inequality $α≥½-Δ$ are formulae that are derived taking into consideration not only the electromagnetic wave absorption energy absorbed by the electromagnetic wave absorbing body but also the interference occurring in the electromagnetic wave absorbing body. This method makes it possible to design an electromagnetic wave absorbing body capable of attenuating electromagnetic waves with high efficiency through a design procedure that involves the thickness of the electromagnetic wave absorbing body and the interference condition that varies according to the application frequency. Furthermore, this method makes it possible to design an electromagnetic wave taking into consideration both of influence of interference that may occur in an electromagnetic wave absorbing body that is thin relative to the wavelength of electromagnetic waves and influence of interference that may occur in an electromagnetic wave absorbing body that is thick relative to the wavelength of electromagnetic waves.

In the case where the electromagnetic wave absorbing body is designed so that parameter α satisfies the relationship: $m+½-Δ≤α≤m+½+Δ$, in which m is an integer that is larger than or equal to 0, an electromagnetic wave absorbing body capable of attenuating electromagnetic waves with high efficiency can be designed even under such conditions that interference with a phase difference that is larger than one wavelength tends to occur.

In the case where parameter m is equal to 0, an electromagnetic wave absorbing body that exhibits high electromagnetic wave attenuation efficiency can be designed though its thickness d is small.

In the case where constant A is equal to $8×10^4/π(Ω/m)$ and constant Δ is equal to $3/10$, an electromagnetic wave absorbing body that exhibits particularly high electromagnetic wave attenuation efficiency can be obtained.

DETAILED DESCRIPTION OF THE INVENTION

An electromagnetic wave absorbing body and a manufacturing method thereof according to an embodiment of the present invention will be hereinafter described with reference to the drawings.
[High Frequency Communication Device Including Electromagnetic Wave Absorbing Body]

For example, the electromagnetic wave absorbing body according to an embodiment of the present invention can be used by disposing it in a metal case of a high frequency communication device. By attenuating electromagnetic waves propagating through the case, coupling between electrical signals and resonance of electromagnetic waves in the case can be suppressed. First, a brief description will be made of a high frequency communication device 1 including such an electromagnetic wave absorbing body.

Figure 1:
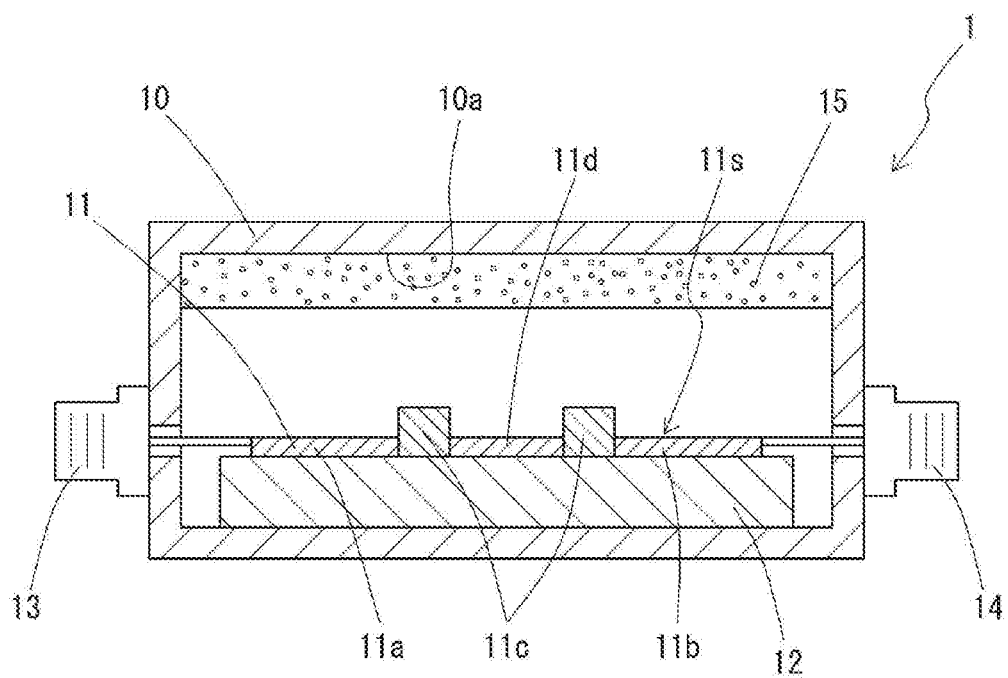
FIG. 1 is a sectional view of an example of a high frequency communication device including an electromagnetic wave absorbing body according to an embodiment of the present invention.

The high frequency communication device 1 has a configuration as outlined in FIG. 1. The high frequency communication device 1 includes a box-shaped case 10 that is approximately shaped like a cuboid and a processing circuit 11 which is housed in the case 10. The case 10 is made of a metal material. The processing circuit 11 is formed on a printed circuit board (PCB) 12 which is made of a dielectric. The processing circuit 11 is provided with, in the form of microstrip lines, an input unit 11a which receives a high frequency signal and an output unit 11b which outputs a high frequency signal. To perform prescribed processing on an electrical signal received from the input unit 11a and output a resulting signal from the output unit 11b, the processing circuit 11 is configured in such a manner that elements 11c such as transistors and ICs are mounted on a mounting surface 11s and connected to each other by inter-element lines 11d which are microstrip lines having a prescribed pattern. The direction in which the input unit 11a and the output unit 11b approximately coincides with the longitudinal axis of the case 10.

A sheet-like electromagnetic wave absorbing body 15 is stuck to a ceiling inner surface 10a of the case 10 so as to be opposed to the printed circuit board 12. The electromagnetic wave absorbing body 15, which will be described later in detail, is formed by dispersing particles including a soft magnetic material (soft magnetic particles) in a matrix including a non-metal material.

The electromagnetic wave absorbing body 15 can reduce the degree of signal coupling that may occur in the microstrip lines (the input unit 11a, the output unit 11b, and inter-element lines 11d) (decoupling). If the electromagnetic wave absorbing body 15 were not stuck to the ceiling inner surface 10a of the case 10 and the metal wall inner surfaces including the ceiling inner surface 10a were exposed, such coupling would exert a great influence and might seriously affect signal processing of the processing circuit 11. The sticking of the electromagnetic wave absorbing body 15 can lower the degree of such coupling to thereby increase the reliability of the processing circuit 11.

The surface(s) to which the electromagnetic wave absorbing body 15 is stuck is not limited to the ceiling inner surface 10a; it can be stuck to any of the inner surfaces of the case 10. For example, the electromagnetic wave absorbing body 15 may be stuck to a side surface(s) that is parallel to the longitudinal direction of the case 10 or the inner surfaces of the end walls that are provided with an input terminal 13 and an output terminal 14, respectively. The electromagnetic wave absorbing body 15 mainly serves to absorb and attenuate electromagnetic waves that propagate approximately parallel to its sheet surface.

Examples of types of devices to which the high frequency communication device 1 is installed (and their communication frequencies) include a personal computer (1 GHz), a cell phone (5 GHz, 10 GHz), and a vehicular radar (24 GHz, 77 GHz).

[Electromagnetic Wave Absorbing Body]

Next, the electromagnetic wave absorbing body 15 according to an embodiment of the present invention to be installed in the above high frequency communication device 1 will be described in detail. As described above, the electromagnetic wave absorbing body 15 is formed as a sheet body in which soft magnetic particles are dispersed in a matrix including a non-metal material.

In the electromagnetic wave absorbing body 15 according to an embodiment of the present invention, parameter α is given by the following Equation (1):

$$\alpha = \frac{Ad\sqrt{\varepsilon\mu}}{\mu'' + \varepsilon''\frac{\mu}{\varepsilon}} \quad (1)$$

in which d is the thickness of the electromagnetic wave absorbing body 15, ε, ε", μ, and μ" are the permittivity, the loss term thereof, the permeability, and the loss term thereof of the electromagnetic wave absorbing body 15, respectively, and A is a constant and is equal to $8\times10^4/\pi(\Omega/m)$.

Parameter α satisfies the condition given by the following Inequality (2).

$$\alpha \geq \frac{1}{5} \quad (2)$$

Parameter α may be set so as to satisfy the following Inequality (2') in the range of Inequality (2):

$$m + \frac{1}{5} \leq \alpha \leq m + \frac{4}{5} \quad (2')$$

in which m is an integer that is larger than or equal to 0 (m=0, 1, 2, . . . ).

As a further alternative, parameter α may be set so as to satisfy the following Inequality (2") by limiting m to 0 in Inequality (2').

$$\frac{1}{5} \leq \alpha \leq \frac{4}{5} \quad (2'')$$

Examples of parameters of the electromagnetic wave absorbing body 15 that can be set so as to satisfy the condition of Inequality (2) (or (2') or (2"); this will also apply to the following description unless otherwise specified) include:

parameters relating to the soft magnetic particles (composition, particle diameter, particle shape, etc.);
parameters relating to the matrix material;
content (filling factor) of the soft magnetic particles;
thickness d; and
application frequency f.

A description will now be made of how parameter α (Equation (1)) and the conditional inequality (2) are derived. Parameter α is derived taking into consideration the electromagnetic wave absorption energy absorbed by the electromagnetic wave absorbing body 15 and electromagnetic wave interference in the electromagnetic wave absorbing body 15.

(Electromagnetic Wave Absorption Energy Absorbed by Electromagnetic Wave Absorbing Body)

Figure 2:
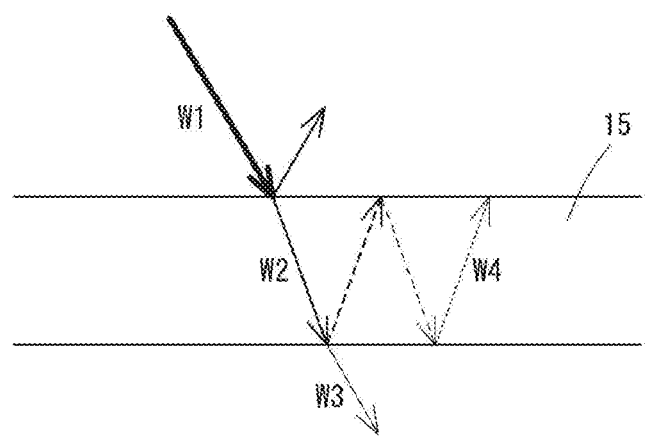
FIG. 2 is a schematic view illustrating how an electromagnetic wave is absorbed and attenuated by the electromagnetic wave absorbing body.

FIG. 2 schematically illustrates how electromagnetic waves behave after incidence thereof into the electromagnetic wave absorbing body 15 that is set independently. A part of a component of an incident wave W1 is reflected by the surface of the electromagnetic wave absorbing body 15 and becomes a reflection wave, and the remaining component W2 enters the inside of the electromagnetic wave absorbing body 15. A part of the component W2 that has entered the inside of the electromagnetic wave absorbing body 15 exits the electromagnetic wave absorbing body 15 through its back surface and becomes a transmission wave W3. The remaining component W4 is subjected to internal reflection in the electromagnetic wave absorbing body 15. As the component W4 travels inside the film of the electromagnetic wave absorbing body 15 by being subjected to (multiple) reflection, its energy is absorbed by the material constituting the electromagnetic wave absorbing body 15 and the component W4 is attenuated (absorptive attenuation).

By setting high the degree of absorptive attenuation inside the electromagnetic wave absorbing body 15, it is possible to prevent the electromagnetic wave W2 that has entered the electromagnetic wave absorbing body 15 from exiting it. That is, the electromagnetic wave attenuation factor of the electromagnetic wave absorbing body 15 can be increased by increasing the electromagnetic wave absorption energy of the electromagnetic wave absorbing body 15.

As for the absorption of electromagnetic waves by a substance, the absorption energy P is given by the following Equation (3):

$$P = \pi f \mu_0 \mu_r'' |H|^2 + \pi f \varepsilon_0 \varepsilon_r'' |E|^2 + \frac{1}{2\rho}|E|^2 \quad (3)$$

in which the first, second, and third terms represent the magnetic loss, the dielectric loss, and the resistive loss, respectively.

In Equation (3) and formulae that will follow, symbols represent the following physical quantities and constants:
P: absorption energy (W/m³);
$\mu_0$: permeability of vacuum (H/m);
$\mu_r$: relative permeability;
$\mu_r''$: loss term of the relative permeability;
$\varepsilon_0$: permittivity of vacuum (A/m);
$\varepsilon_r$: relative permittivity;
$\varepsilon_r''$: loss term of the relative permittivity;
ρ: resistivity (Ω·m);
H: magnetic field strength (A/m);
E: electric field strength (V/m); and
f: frequency (Hz).

The complex permeability μ (H/m) and the complex permittivity (A/m) of the electromagnetic wave absorbing body 15 are given as follows.

$$\mu = \mu_0 \mu_r = \mu' - j\mu'' = \mu_0(\mu_r' - j\mu_r'') \quad (4\text{-}1)$$

$$\varepsilon = \varepsilon_0 \varepsilon_r = \varepsilon' - j\varepsilon'' = \varepsilon_0(\varepsilon_r' - j\varepsilon_r'') \quad (4\text{-}2)$$

An electromagnetic wave propagating through the metal-made case 10 in the longitudinal direction thereof can be regarded as a plane wave. For a plane wave, the impedance Z(Ω) is given by the following Equation (5).

$$Z = \frac{E}{H} = \sqrt{\frac{\mu_0 \mu_r}{\varepsilon_0 \varepsilon_r}} \quad (5)$$

From Equation (5), the relationship between the electric field E and the magnetic field H is given by the following Equation (6).

$$E = H\sqrt{\frac{\mu_0 \mu_r}{\varepsilon_0 \varepsilon_r}} \quad (6)$$

Using Equation (6), Equation (3) can be rearranged into the following Equation (7).

$$P = |H|^2 \left( \pi f \mu_0 \mu_r'' + \pi f \varepsilon_0 \varepsilon_r'' \left| \frac{\mu_0 \mu_r}{\varepsilon_0 \varepsilon_r} \right| + \frac{1}{2\rho} \left| \frac{\mu_0 \mu_r}{\varepsilon_0 \varepsilon_r} \right| \right) \quad (7)$$

In Equation (7), the third term can be disregarded in the case where the contribution of the resistive loss is small. In the case where the frequency f of electromagnetic waves is in a GHz band, the resistivity ρ (Ω·m) of the electromagnetic wave absorbing body 15 under consideration which is obtained by dispersing soft magnetic particles in a matrix including a non-metal material is smaller than the frequency f (Hz) by about three orders. For example, in a sheet of 0.5 mm in thickness that is obtained by dispersing soft magnetic particles having a composition of Fe-13Cr-1Si (content: 50 vol %) in a matrix including an epoxy resin, $\rho=10^7$ ($\Omega \cdot m$) was observed at $f=2.4 \times 10^{10}$ (Hz). In this case, in Equation (7), the third term is far smaller than the second term and hence can be disregarded. And Equation (7) can be approximated to be the following Equation (8).

$$P = |H|^2 \pi f \left( \mu_0 \mu_r'' + \varepsilon_0 \varepsilon_r'' \left| \frac{\mu_0 \mu_r}{\varepsilon_0 \varepsilon_r} \right| \right) \qquad (8)$$

It is seen from Equation (8) that the absorption energy P can be increased by increasing the loss terms $\mu_r''$ and $\varepsilon_r''$ of the relative permeability and the relative permittivity. However, as described below, the attenuation of electromagnetic waves by the electromagnetic wave absorbing body 15 is influenced by not only the absorption energy P but also the interference of electromagnetic waves in the electromagnetic wave absorbing body 15. It is therefore necessary to consider the contributions of these two factors in an integrated manner.

(Interference of Electromagnetic Waves in Electromagnetic Wave Absorbing Body)

The above description has been made by taking into consideration only the absorptive attenuation of electromagnetic waves that have entered the electromagnetic wave absorbing body 15. However, in actuality, electromagnetic waves should undergo interference in the electromagnetic wave absorbing body 15 which is stuck to the inner wall surface of the case 10.

Figure 3:
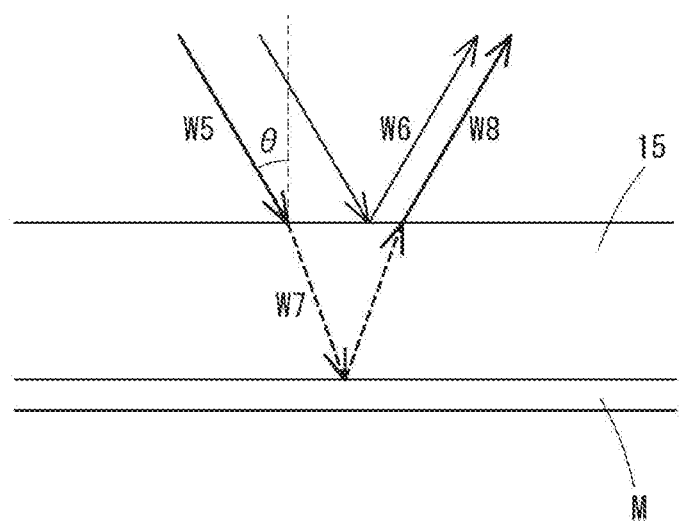
FIG. 3 is a schematic view illustrating how interference of an electromagnetic wave occurs in the electromagnetic wave absorbing body.

FIG. 3 assumes a state that the electromagnetic wave absorbing body 15 is stuck to a metal plate M such as an inner wall surface of the case 10 and an incident wave W5 enters the electromagnetic wave absorbing body 15 from the air side at an incident angle θ. A part of a component of the incident wave W5 is reflected at the interface between the air and the electromagnetic wave absorbing body 15 to become a wave W6. The remaining component of the incident wave W5 travels inside the electromagnetic wave absorbing body 15 as a wave W7. The wave W7 is reflected at the interface between the electromagnetic wave absorbing body 15 and the metal plate M and goes backward and exits the electromagnetic wave absorbing body 15 through the interface with the air to become a wave W8. The reflection wave W6 reflected from the air-side interface and the reflection wave W8 reflected from the metal-plate-M-side interface interfere with each other due to a difference between their optical path lengths.

The interference condition is given by the following Equation (9):

$$d \cos \theta = \frac{1}{2\sqrt{\varepsilon_r \mu_r}} \alpha \lambda = \frac{1}{2\sqrt{\varepsilon_r \mu_r}} \alpha \frac{c}{f} \qquad (9)$$

in which d is the thickness of the electromagnetic wave absorbing body 15, λ is the wavelength of electromagnetic waves, and c is the speed of light.

Electromagnetic waves that propagate near the surface of the electromagnetic wave absorbing body 15 in the longitudinal direction of the case 10 can be regarded as of the quasi-TEM mode. Electromagnetic waves of the quasi-TEM mode have an electric field component and a magnetic field component in the traveling direction (i.e., in the longitudinal direction of the case 10), and go into the electromagnetic wave absorbing body 15. To examine how electromagnetic wave components behave inside the electromagnetic wave absorbing body 15, assume that θ is equal to 90° in Equation (9). Then Equation (9) becomes the following Equation (10).

$$d = \frac{1}{2\sqrt{\varepsilon_r \mu_r}} \alpha \frac{c}{f} \qquad (10)$$

Equation (10) shows that the two reflection waves W6 and W8 are equalized in phase and strengthen each other when α=m, in which m is an integer that is larger than or equal to 0 (m=0, 1, 2, . . . ). On the other hand, when α=m+½, the phases of the reflection waves W6 and W8 deviate from each other by a half wavelength (i.e., they are opposite to each other in phase) and hence cancel out each other.

That is, under the condition that α is equal to or close to m, the electromagnetic wave absorbing body 15 cannot attenuate electromagnetic waves effectively. On the other hand, under the condition that α is equal to or close to m+½, the electromagnetic wave absorbing body 15 can attenuate electromagnetic waves effectively because of the effect that reflection waves cancel out each other.

Rearranging Equation (10), the following Equation (11) is obtained.

$$f = \frac{\alpha c}{2 d \sqrt{\varepsilon_r \mu_r}} \qquad (11)$$

(Integration of Absorption Energy Effect and Interference Effect)

As described above, not only the effect of absorption energy P but also the interference effect influences the attenuation of electromagnetic waves by the electromagnetic wave absorbing body 15. It is therefore necessary to consider these two effects in a unified manner.

Substituting Equation (11) which is derived from the interference condition of electromagnetic waves into Equation (8) which represents the absorption energy P, the following Equation (12) is obtained.

$$P = \frac{|H|^2 \pi \alpha c}{2 d \sqrt{\varepsilon_r \mu_r}} \left( \mu_0 \mu_r'' + \varepsilon_0 \varepsilon_r'' \left| \frac{\mu_0 \mu_r}{\varepsilon_0 \varepsilon_r} \right| \right) \qquad (12)$$

Rearranging Equation (12), the following Equation (13) is obtained.

$$\alpha = \frac{2 P d}{\pi c |H|^2} \frac{\sqrt{\varepsilon_r \mu_r}}{\mu_0 \mu_r'' + \varepsilon_0 \varepsilon_r'' \left| \frac{\mu_0 \mu_r}{\varepsilon_0 \varepsilon_r} \right|} \qquad (13)$$

Since $$c = \frac{1}{\sqrt{\varepsilon_0 \mu_0}}, \qquad (14)$$

Equation (13) becomes $$\alpha = \frac{2Pd}{\pi|H|^2} \frac{\sqrt{\varepsilon_0 \varepsilon_r \mu_0 \mu_r}}{\mu_0 \mu_r'' + \varepsilon_0 \varepsilon_r'' \left|\frac{\mu_0 \mu_r}{\varepsilon_0 \varepsilon_r}\right|}. \quad (15)$$

Now, the following parameter A is introduced:

$$A = \frac{2P}{\pi|H|^2}. \quad (16)$$

Rearranging Equation (15) using Equations (16) as well as Equations (4-1) and (4-2), Equation (1) which was shown at the beginning can be obtained.

$$\alpha = \frac{Ad\sqrt{\varepsilon\mu}}{\mu'' + \varepsilon''\frac{\mu}{\varepsilon}} \quad (1)$$

The parameter A is a constant because as described above the electromagnetic wave absorption energy P is a constant that is determined by the material composition of the electromagnetic wave absorbing body 15.

As pointed out above in describing the interference of electromagnetic waves in the electromagnetic wave absorbing body 15, the attenuation factor of electromagnetic waves can be maximized through mutual cancellation of reflection waves when $\alpha = m + \frac{1}{2}$. Thus, an appropriate measure is to set the thickness d of the electromagnetic wave absorbing body 15 and select its material composition which determines the permittivity $\varepsilon$, its loss term $\varepsilon''$, the permeability $\mu$, and its loss term $\mu''$ so that $\alpha = m + \frac{1}{2}$ results in Equation (1).

The attenuation factor of electromagnetic waves decreases as parameter $\alpha$ comes closer to m or m+1 from $m+\frac{1}{2}$. However, parameter $\alpha$ need not always be set equal to $m+\frac{1}{2}$ that provides the largest attenuation factor; in a practical use of the high frequency communication device 1 or the like, in many cases, an attenuation factor that is somewhat smaller than the maximum value is allowable.

In view of this, the parameters $\varepsilon$, $\varepsilon''$, $\mu$, $\mu''$, and d may be set so that parameter $\alpha$ becomes equal to $m+\frac{1}{2}$ or somewhat deviates from it within an allowable deviation range $\pm\Delta$ that is set according to a desired electromagnetic wave attenuation factor (provided that, $\Delta < \frac{1}{2}$). That is, the above parameters may be set so that a relationship shown by Inequality (17') is satisfied.

$$m + \frac{1}{2} - \Delta \leq \alpha \leq m + \frac{1}{2} + \Delta \quad (17')$$

Inequality (2') that was shown in the beginning part $$m + \frac{1}{5} \leq \alpha \leq m + \frac{4}{5} \quad (2')$$

is obtained when $\Delta = \frac{3}{10}$.

In this manner, an electromagnetic wave absorbing body 15 can be designed so as to exhibit a large electromagnetic wave attenuation factor while its material composition and thickness d are set within allowable ranges that are wide to some extent.

In Inequality (17'), parameter m represents the integer component of the phase difference between the reflection waves W6 and W8. When m=0, the phase difference between the two reflection waves W6 and W8 is within one wavelength. That is, the electromagnetic wave W7 travels inside the electromagnetic wave absorbing body 15 with the phase difference being within one wavelength and then interferes, as the reflection wave W8, with the reflection wave W6 reflected from the air-side interface.

On the other hand, when $m \geq 1$, the phase difference between the two reflection waves W6 and W8 is larger than or equal to one wavelength. That is, the electromagnetic wave W7 travels inside the electromagnetic wave absorbing body 15 with the phase difference being larger than or equal to one wavelength and then interferes, as the reflection wave W8, with the reflection wave W6 reflected from the air-side interface. The parameter m increases as the electromagnetic wave absorbing body 15 becomes thicker.

In deriving Inequality (17') above, it is assumed that the reflection waves W6 and W8 interfere with each other with the same degree of contribution (see Equation (9)). However, in actuality, if the electromagnetic wave W7 is absorbed to a large extent in traveling inside the electromagnetic wave absorbing body 15, the amplitude of the reflection wave W8 which finally exits from the surface of the electromagnetic wave absorbing body 15 is made small. In this case, the contribution of the reflection wave W8 to the interference with the reflection wave W6 may be so small that the contribution of the reflection wave W8 to an interference wave (i.e., a composite wave of the two reflection waves W6 and W8) can be disregarded.

This situation occurs more likely as the electromagnetic wave W7 travels inside the electromagnetic wave absorbing body 15 a longer distance relative to the wavelength of the electromagnetic wave W7. That is, as parameter $\alpha$ in Inequality (17') increases, the degree of electromagnetic wave absorption in the electromagnetic wave absorbing body 15 may become so dominant that the electromagnetic wave absorbing body 15 exhibits a large attenuation factor even without considering the interference with the reflection wave W6.

It is understood from the above point of view that it is possible to design easily and manufacture an electromagnetic wave absorbing body 15 that exhibits an attenuation factor that is large to some extent by setting an upper limit value and a lower limit value of parameter $\alpha$ without the need for using a large-m range, m corresponding to the interference of the reflection wave W8 that travels inside the electromagnetic wave absorbing body 15 a long distance relative to the wavelength. As long as a lower limit of parameter $\alpha$ is set taking into consideration the effect of interference between the two reflection waves W6 and W8, an electromagnetic wave attenuation factor that is large to some extent can be attained in a large-$\alpha$ range, that is, a range where the thickness d of the electromagnetic wave absorbing body 15 is large and/or the frequency f of the electromagnetic wave is high. More specifically, it is appropriate to set parameter $\alpha$ by determining only its lower limit value in the case of m=0. That is, parameter $\alpha$ can be set according to the following Inequality (17).

$$\alpha \geq \frac{1}{2} - \Delta \quad (17)$$

Furthermore, Inequality (2) is obtained when $\Delta=3/10$.

$$\alpha \geq \frac{1}{5} \quad (2)$$

As the electromagnetic wave absorbing body 15 is made thicker, parameter $\alpha$ becomes larger and hence it becomes possible to satisfy Inequality (17) with a larger margin. However, from the viewpoints of space saving and reduction of the cost of the materials used for manufacture of the electromagnetic wave absorbing body 15, it is in many cases desired to make the electromagnetic wave absorbing body 15 as thin as possible. In this case, it is preferable to set an upper limit value for parameter $\alpha$. Applying a restriction m=0 to Inequality (17'), the condition for parameter $\alpha$ becomes as shown in the following Inequality (17").

$$\frac{1}{2} - \Delta \leq \alpha \leq \frac{1}{2} + \Delta \quad (17")$$

Furthermore, Inequality (2") is obtained when $\Delta=3/10$.

Since the restriction m=0 is employed in Inequality (17"), the electromagnetic wave absorbing body 15 can be designed so as to be as thin as possible. As described above, when m=0, the contribution to the interference of the reflection wave W8 that has traveled inside the electromagnetic wave absorbing body 15 is relatively large. However, by setting a lower limit value $1/2-\Delta$, it is possible to prevent the attenuation factor from becoming insufficient due to the influence by interference that occurs when the electromagnetic wave absorbing body 15 is too thin, that is, interference in a range in which the phase difference between the two reflection waves W6 and W8 is close to zero.

On the other hand, by setting an upper limit value $1/2+\Delta$, it is possible to prevent the attenuation factor from becoming insufficient due to the influence by interference that occurs when the electromagnetic wave absorbing body 15 is too thick, that is, interference in a range in which the phase difference between the two reflection waves W6 and W8 is close to one wavelength.

It is appropriate that according to which of Inequalities (17), (17'), and (17") (or Inequalities (2), (2'), and (2")) parameter $\alpha$ should be set be determined according to desired ranges of the thickness d of the electromagnetic wave absorbing body 15 and the frequency f of electromagnetic waves, the material composition of the electromagnetic wave absorbing body 15, and other factors.

For example, Inequality (17') (or Inequality (2')) may be used in a case that an electromagnetic wave absorbing body 15 having an assumed material composition is low in electromagnetic wave absorption capability and hence the influence of the interference between the reflection wave W6 reflected from the surface of the electromagnetic wave absorbing body 15 and the reflection wave W8 reflected from the metal-plate-M-side interface is large though the phase difference between the reflection waves is larger than or equal to one wavelength or in a case that it is required to design, strictly, an electromagnetic wave absorbing body 15 that exhibits a large attenuation factor.

Inequality (17) (or Inequality (2)) may be used in a case that the influence of interference with a phase difference of one or more wavelengths is not so problematic and it is desired to design and manufacture the electromagnetic wave absorbing body 15 easily. In a case of designing a thin electromagnetic wave absorbing body 15 in a specialized manner, Inequality (17") (or Inequality (2")) may be used.

Parameter A can be set according to a desired electromagnetic wave attenuation factor. For example, an actual measurement can be made using a rectangular waveguide 20 shown in FIG. 4 which is a model of the metal-made case 10 of the high frequency communication device 1. An electromagnetic wave absorbing body 15 having a predetermined thickness is stuck to one inner wall surface of the waveguide 20. High frequency electromagnetic waves are caused to propagate through the waveguide 20 using a transducer (not shown). A transmittance $S_{21}$ is measured at a predetermined frequency component using a network analyzer. The transmittance $S_{21}$ of electromagnetic waves is given by Equation (18):

$$S_{21}[dB] = 20\log\frac{V_2}{V_1} \quad (18)$$

in which $V_1$ and $V_2$ are the input voltage of electromagnetic waves that are input to the waveguide 20 and the output voltage of transmitted electromagnetic waves, respectively. $-S_{21}$ is the electromagnetic wave attenuation factor.

It is appropriate to set parameter A so that an electromagnetic wave attenuation factor having a desired large value is measured in the above manner. More specifically, absorption energy P per unit volume of the material constituting an electromagnetic wave absorbing body 15 for which a desired large electromagnetic wave attenuation factor has been obtained by a measurement is measured by a method using the waveguide 20 as described above. A value of parameter A is calculated by substituting the measured absorption energy P and a magnetic field intensity H into Equation (16).

For example, absorption energy P of $4\times10^4$ W/m$^3$ was obtained with a magnetic field intensity H of 1 A/m for an electromagnetic wave absorbing body 15 produced by dispersing, in an acrylic rubber matrix, soft magnetic particles (content: 50%) having a particle diameter of 8 µm and having a composition of Fe-13Cr-1Si (Fe-13% Cr-1% Si; this kind of expression will also apply to the following description). A value of parameter A that is calculated on the basis of this measured absorption energy P value is $8\times10^4/\pi$ ($\Omega$/m). As described in Examples later, electromagnetic wave absorbing bodies 15 having this material composition exhibit very large electromagnetic wave attenuation factors. Using such an electromagnetic wave absorbing body 15 as a reference sample for determining a value of parameter A, various electromagnetic wave absorbing bodies 15 having large electromagnetic wave attenuation factors can be designed with high accuracy according to Equation (1).

Figure 5:
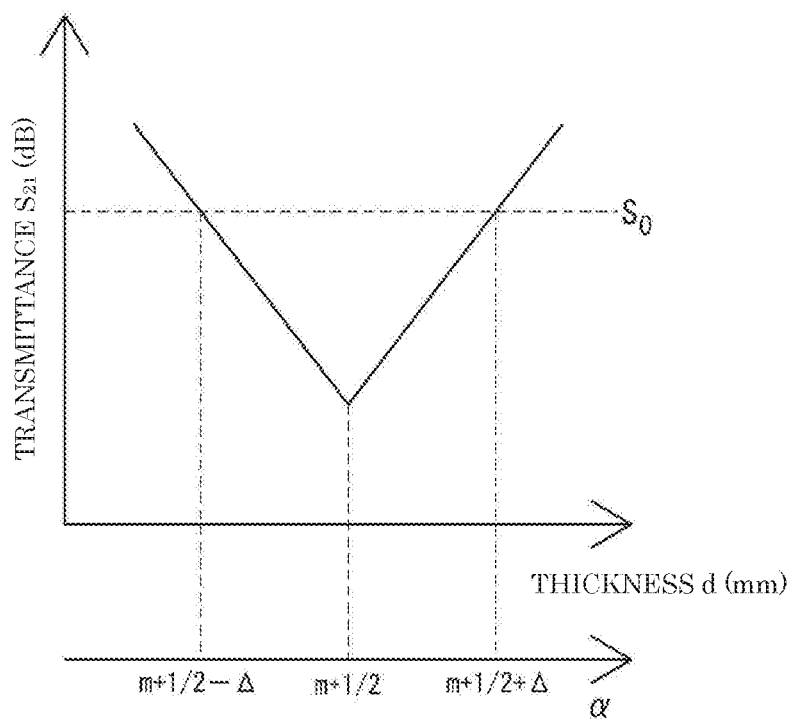
FIG. 5 is a graph showing a relationship between the electromagnetic wave transmittance $S_{21}$ of the electromagnetic wave absorbing body and each of the thickness d and parameter α.

As will be confirmed in Examples described later, electromagnetic wave transmittance values $S_{21}$ that are measured in the above-described manner by varying the thickness d of the electromagnetic wave absorbing body 15 exhibit a V-shaped dependence as shown in FIG. 5 with respect to the thickness d. As seen from Equation (1), the parameter $\alpha$ is proportional to the thickness d of the electromagnetic wave absorbing body 15 in the case where the same material is used and hence the parameters $\varepsilon'$, $\varepsilon"$, $\mu'$, and $\mu"$ are constant. Namely, the horizontal axes of FIG. 5 is proportional to the parameter $\alpha$.

The valley (minimum point) of the V-shaped curve corresponds to $\alpha=m+1/2$ where electromagnetic waves are weakened most through cancellation by interference. A value of parameter A can be determined by substituting $\alpha = m + \frac{1}{2}$ together with the corresponding thickness d of the electromagnetic wave absorbing body 15 and values of $\epsilon$, $\epsilon''$, $\mu$, and $\mu''$ that are determined by the material of the electromagnetic wave absorbing body 15 into Equation (1). The parameter m is equal to 0 in the case of FIG. 5.

Furthermore, an upper limit value of the transmittance $S_{21}$ that is permitted in the actual high frequency communication device 1 is represented by $S_0$. In a case where parameter A is equal to $8 \times 10^4/\pi (\Omega/m)$, it is appropriate to set parameter $\Delta$ that indicates an allowable range of parameter $\alpha$ so that it corresponds to the range $S_{21} \leq S_0$ in the manner shown in FIG. 5. As described in Examples later, by setting parameter $\Delta$ at $3/10$, it is possible to obtain an electromagnetic wave absorbing body 15 that exhibits a good electromagnetic wave attenuation factor $S_{21} \leq -15$ dB in terms of a transmittance per electromagnetic wave propagation distance of 100 mm.

In a case where the transmittance $S_{21}$ per 100 mm (a distance in the electromagnetic wave absorbing body 15) is smaller than or equal to $-15$ dB, a sufficient coupling suppressing function can be obtained in the high frequency communication device 1. It is even preferable that the transmittance $S_{21}$ be smaller than or equal to $-20$ dB.

As described above, it is appropriate to set the thickness d of the electromagnetic wave absorbing body 15 so that parameter $\alpha$ that is calculated according to Equation (1) satisfies Inequality (17) (or Inequality (17') or (17")); this will also apply to the following description unless otherwise specified). However, if the electromagnetic wave absorbing body 15 is too thin, it cannot absorb and attenuate electromagnetic waves sufficiently; it is preferable that its thickness d be larger than or equal to 1 $\mu$m. On the other hand, if the electromagnetic wave absorbing body 15 is too thick, it is difficult to handle as a sheet body and requires a large space when installed in, for example, the case 10 of the high frequency communication device 1. It is therefore preferable that the thickness d of the electromagnetic wave absorbing body 15 be smaller than or equal to 20 mm.

Parameters $\epsilon$, $\epsilon''$, $\mu$, and $\mu''$ depend on the frequency. By substituting values of $\epsilon$, $\epsilon''$, $\mu$, and $\mu''$ corresponding to an application frequency into Equation (1), a value of parameter $\alpha$ can be calculated without using a frequency and used in making a judgment according to Inequality (17). However, by setting a frequency range to 1 (GHz)$\leq f \leq$100 (GHz), a good agreement can be obtained between a result of calculation of parameter $\alpha$ according to Equation (1) and judgment according to Inequality (17) and an actually obtained electromagnetic wave attenuation factor of the electromagnetic wave absorbing body 15. If the electromagnetic wave absorbing body 15 is used within the above frequency range, it can be used suitably in high frequency communication devices that are installed in various apparatus such as personal computers, cell phones, and vehicular radars which are recited above.

An electromagnetic wave absorbing body 15 that exhibits a superior electromagnetic wave attenuation effect can be obtained with high accuracy by designing it using parameter $\alpha$ that is derived by integrating the two effects occurring in the electromagnetic wave absorbing body 15, that is, the absorptive attenuation effect that is estimated using absorption energy as an index and the electromagnetic wave interference effect. If values of parameters A and $\Delta$ are set in advance so as to attain a desired electromagnetic wave attenuation factor, an electromagnetic wave absorbing body 15 capable of attaining high electromagnetic wave attenuation efficiency at a specified application frequency by selecting or setting a material and a thickness of the electromagnetic wave absorbing body 15 according to Equation (1) and Inequality (17) (or Inequality (2)), without the need for measuring an electromagnetic wave attenuation factor or transmittance of each electromagnetic wave absorbing body 15.

(Materials Constituting Electromagnetic Wave Absorbing Body)

There are no particular limitations on the composition of the soft magnetic material constituting particles dispersed in the electromagnetic wave absorbing body 15. The soft magnetic material is typically a metal. Preferable examples of the soft magnetic material include Sendust, Fe, an Fe—Si-based alloy, an Fe—Ni-based alloy (permalloy), an Fe—Co-based alloy, an Fe—Cr-based alloy, an Fe—Cr—Al-based alloy, an Fe—Cr—Si-based alloy, a ferrite-based stainless steel alloy, an austenite-based stainless steel alloy, an Ni-based alloy, a Co-based alloy, an Ni—Cr-based alloy, and ferrite. It is appropriate to form particles by, for example, a molten metal spray method using any of the above materials. Among the above materials, the Fe—Si-based alloy, the Fe—Cr-based alloy, and the Fe—Cr—Si-based alloy exhibit particularly good attenuation characteristics for high frequency electromagnetic waves.

The matrix constituting the electromagnetic wave absorbing body 15 includes a non-metal material. Although there are no particular limitations on the specific kind of the matrix material, dielectrics, in particular, ones made of an organic polymer such as a resin (plastic material), a rubber or an elastomer, can be used suitably. More specifically, preferable examples thereof include polyethylene chloride, an acrylic rubber, a silicone rubber, EPDM (ethylene-propylene-diene rubber), an ethylene-propylene rubber, polyphenylene sulfide, an epoxy resin, and a liquid crystal polymer.

The electromagnetic wave absorbing body 15 can be produced by mixing soft magnetic particles as described above into the matrix material and dispersing the former in the latter. For example, soft magnetic particles are mixed into an organic polymer matrix material in slurry form at a prescribed mixing ratio using a stirring-mixing-deaeration machine or the like, and then a resulting mixture is molded into a desired shape using a mold or the like. The matrix material is solidified thereafter by drying, for example.

The electromagnetic wave absorptive attenuation effect that is realized by the soft magnetic particles can be utilized more easily by setting the content (filling factor) of the soft magnetic particles in the electromagnetic wave absorbing body 15 to 30 vol % or more. It is preferable to set the content of the soft magnetic particles to 50 vol % or more. On the other hand, if the content of the soft magnetic particles is set too large, the permeability is reduced in a high frequency range, which makes it difficult to increase the absorption energy effectively. It is preferable that the content of the soft magnetic particles is 60 vol % or less.

EXAMPLES

The present invention will be described below in a more specific manner using Examples.

(Manufacture of Electromagnetic Wave Absorbing Body)

First, sets of soft magnetic particles having respective compositions and particle diameters (described below) were produced by a molten metal spray method. Each set of soft magnetic particles thus produced was added to a plastic acrylic resin or a silicone resin at a predetermined content and mixed into the latter using a stirring-mixing-deaeration machine to produce a mixed slurry. The resulting mixed slurry was let flow into a mold and molded into a sheet shape. The resulting sheet-like member was subjected to drying, punching, and thickness adjustment, whereby an electromagnetic wave absorbing body sample to be evaluated was produced.

(Evaluation of Electromagnetic Wave Transmittance)

Electromagnetic wave transmittance values of the electromagnetic wave absorbing body samples produced above were measured using a waveguide 20 in the manner described above with reference to FIG. 4. A rectangular waveguide that is prescribed in JIS WRJ-22 and is suitable for an evaluation frequency was used. Each of the electromagnetic wave absorbing body samples produced above was stuck to an inner wall surface of the waveguide 20.

Figure 4:
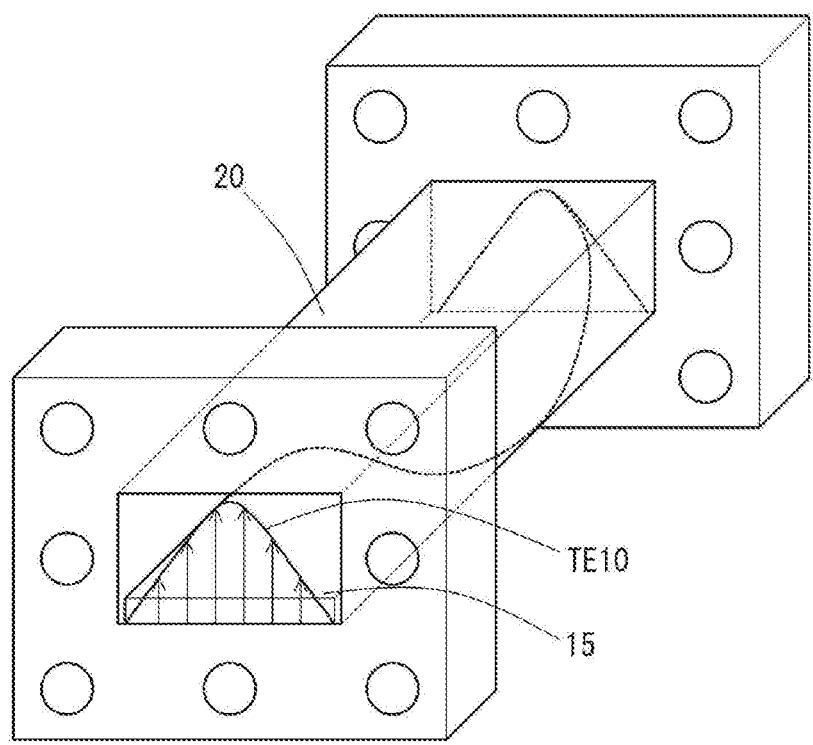
FIG. 4 illustrates a measurement method of an electromagnetic wave transmittance $S_{21}$ of the electromagnetic wave absorbing body.

Microwaves were generated in the waveguide 20 using a transducer (not shown). A transmittance $S_{21}$ (a ratio of transmitting in the longitudinal direction) at an evaluation frequency component using a network analyzer as a value per 100 mm (in the longitudinal direction). In the waveguide 20 used in this evaluation, in high-order modes, the Poynting vector energy (propagation energy) is so small that almost no energy propagates. As shown in FIG. 4, TE10-mode waves are generated dominantly and propagate through the waveguide 20.

(Confirmation of how Transmittance Varies with Thickness of Electromagnetic Wave Absorbing Body)

It was confirmed whether the relationship between the transmittance and the thickness of the electromagnetic wave absorbing body 15 as shown schematically in FIG. 5 held actually. First, electromagnetic wave absorbing body samples were produced using soft magnetic particles having a composition of Fe-13Cr-1Si and an acrylic resin (matrix material). The diameter of the soft magnetic particles was set at two values, that is, 9.1 µm and 6.6 µm, and the content of the soft magnetic particles was set at 50 vol %. Plural kinds of electromagnetic wave absorbing body samples that were different from each other in thickness were produced. Then, as described above, values of transmittance $S_{21}$ per 100 mm were measured using the waveguide 20 by setting the evaluation frequency at 24 GHz.

Figure 6:
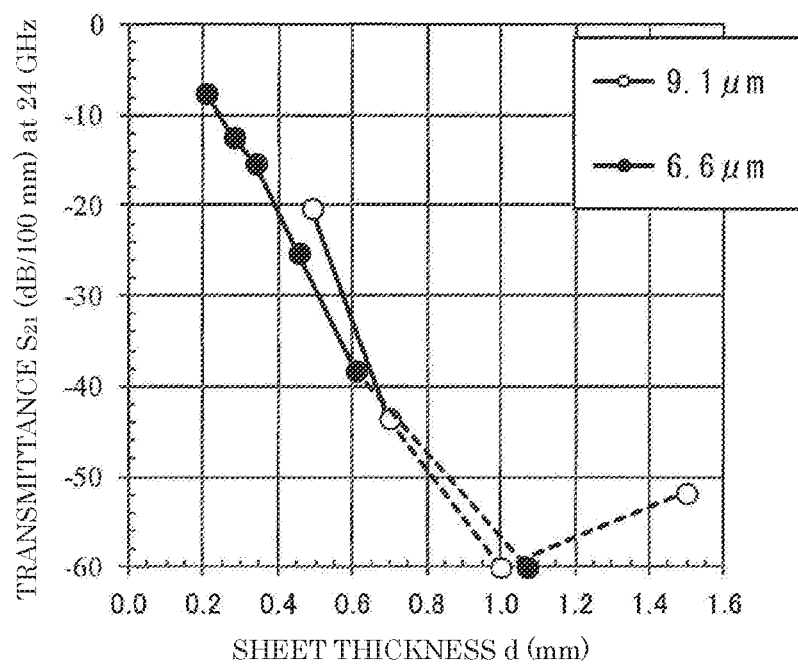
FIG. 6 is a graph showing relationships between the thickness d and the measured electromagnetic wave transmittance $S_{21}$ of the electromagnetic wave absorbing body.

FIG. 6 is a graph showing relationships between the thickness (sheet thickness) d and the measured transmittance $S_{21}$ of the electromagnetic wave absorbing body samples. It is seen from FIG. 6 that the curves representing the dependence of the transmittance $S_{21}$ on the thickness d have a valley like the curve shown in FIG. 5. Thus, it is confirmed that the method of evaluating electromagnetic wave attenuation by the electromagnetic wave absorbing body 15 according to the above-described model in which the absorption energy effect and the electromagnetic wave interference effect of the electromagnetic wave absorbing body 15 are integrated together is appropriate. It is also seen that the particle diameter of the soft magnetic particles has almost no influence on the transmittance $S_{21}$.

(Evaluation of Electromagnetic Wave Absorbing Body Using Parameter α)

Table 1 shows values of parameter α calculated according to Equation (1) and measured transmittance $S_{21}$ values that were obtained by varying the composition and the thickness d of the electromagnetic wave absorbing body sample, the content of the soft magnetic particles, and the application frequency in various manners. In Equation (1), parameter A was set at $8\times10^4/\pi(\Omega/m)$. Each value of parameter α was calculated using values of ε', ε", µ, and µ" that were obtained on the basis of a frequency response measurement result of the transmittance $S_{21}$ of measurements using the network analyzer, and is also shown in Table 1. In Table 1, each value of parameter α is shown in the form of α' (obtained by deducting the contribution of a maximum integer m from α) as a fraction having a denominator 500 (0<α'<1, α=m+α').

TABLE 1

| | Matrix resin | Soft Magnetic particles Composition | Particle diameter (µm) | Content (vol %) | Thickness d (mm) | Frequency f (GHz) | ε' (A/m) | ε" (A/m) | µ' (H/m) | µ" (H/m) | α = m + α' | | Transmittance $S_{21}$ (dB/ 100 mm) |
|---|---|---|---|---|---|---|---|---|---|---|---|---|---|
| | | | | | | | | | | | m | α' | |
| Example 1 | Acrylic | Fe—13Cr—1Si | 8 | 50 | 0.50 | 1 | 25.60 | 0.90 | 1.00 | 0.10 | 1 | 133/500 | <−60 |
| Example 2 | | | | 50 | 0.50 | 100 | 25.00 | 0.90 | 0.10 | 0.20 | 0 | 196/500 | −21 |
| Example 3 | | | | 50 | 20.00 | 1 | 25.60 | 0.90 | 1.00 | 0.10 | 50 | 339/500 | <−60 |
| Example 4 | | | | 30 | 0.50 | 20 | 14.00 | 0.50 | 0.70 | 0.50 | 0 | 111/500 | −29 |
| Example 5 | | | | 5 | 0.50 | 20 | 3.40 | 0.10 | 1.00 | 0.00 | 2 | 59/500 | −9 |
| Example 6 | | | | 60 | 19.00 | 20 | 50.00 | 0.70 | 0.30 | 0.80 | 10 | 214/500 | <−60 |
| Example 7 | | | | 60 | 1.80 | 20 | 49.00 | 0.65 | 0.31 | 0.79 | 0 | 494/500 | −16 |
| Example 8 | | Fe—17Cr—13Ni | | 30 | 0.50 | 20 | 10.00 | 0.16 | 1.00 | 0.01 | 4 | 90/500 | −17 |
| Example 9 | | Fe—8Si—4Cr | | 30 | 0.50 | 20 | 13.50 | 0.50 | 0.60 | 0.50 | 0 | 105/500 | −25 |
| Example 10 | Silicone | Fe—13Cr—1Si | | 30 | 0.50 | 20 | 13.50 | 0.45 | 0.70 | 0.50 | 0 | 110/500 | −28 |
| Comparative Example 1 | Acrylic | Fe—13Cr—1Si | 8 | 30 | 0.10 | 20 | 14.00 | 0.50 | 0.70 | 0.50 | 0 | 22/500 | −7 |
| Comparative Example 2 | | | | 30 | 0.001 | 20 | 14.00 | 0.50 | 0.70 | 0.50 | 0 | 0 | −1 |
| Comparative Example 3 | | | | 30 | 0.10 | 10 | 14.00 | 0.50 | 1.20 | 0.25 | 0 | 48/500 | −5 |

It is seen from Table 1 that a transmittance $S_{21}$ value that was smaller than or equal to −15 (dB/100 mm) (i.e., an attenuation factor value that was larger than or equal to 15 (dB/100 mm)) was obtained, that is, the electromagnetic wave attenuation by the electromagnetic wave absorbing body 15 was sufficient, in each of part of Examples in which parameter α' was larger than or equal to ⅕ when the kind of matrix resin, the composition, the particle diameter, and the content of the soft magnetic particles, the thickness d of the electromagnetic wave absorbing body 15, and the application frequency were varied.

In contrast, in each of Comparative Examples in which parameter α' was smaller than ⅕ because the thickness d of the electromagnetic wave absorbing body 15 was small, a large transmittance $S_{21}$ value was obtained that was larger than or equal to −7 (dB/100 mm), that is, the electromagnetic wave attenuation by the electromagnetic wave absorbing body 15 was insufficient. In particular, in Comparative Example 2 in which the thickness d of the electromagnetic wave absorbing body 15 was extremely small, parameter α was so small as to approximate to 0 and, accordingly, the transmittance $S_{21}$ was particularly large.

These results show that parameter α serves as a good index for evaluating the electromagnetic wave attenuation by the electromagnetic wave absorbing body 15, and enables manufacture of an electromagnetic wave absorbing body 15 exhibiting a superior attenuation characteristic with the use of the criterion of α≥⅕.

In Examples 1-4, 6, 9, and 10, parameter α' is in a range of ⅕≤α'≤⅘, that is, parameter α is in a range of m+⅕≤α≤m+⅘. On the other hand, in Examples 5, 7, and 8, parameter α' (α) is out of this range. Accordingly, the transmittance $S_{21}$ values are particularly small in Examples 1-4, 6, 9, and 10.

Although the embodiment of the present invention has been described above in detail, the present invention is not limited to the embodiment and various modifications are possible without departing from the gist of the invention.

The present application is based on Japanese patent application No. 2016-199746 filed on Oct. 11, 2016, and the contents of which are incorporated herein by reference.

DESCRIPTION OF REFERENCE NUMERALS AND SIGNS

1: High frequency communication device
15: Electromagnetic wave absorbing body
20: Waveguide

What is claimed is:

1. An electromagnetic wave absorbing body comprising a sheet-like electromagnetic wave absorbing body in which particles comprising a soft magnetic material are dispersed in a matrix comprising a non-metal material, wherein the electromagnetic wave absorbing body satisfies a relationship: α≥⅕, in which α is a parameter given by Equation (1):

$$\alpha = Ad(\varepsilon\mu)^{0.5}/(\mu''+\varepsilon''\mu/\varepsilon) \qquad (1)$$

in which d is a thickness of the electromagnetic wave absorbing body, ε, ε", μ, and μ" are a permittivity of the electromagnetic wave absorbing body, a loss term of ε, a permeability of the electromagnetic wave absorbing body, and a loss term of μ, respectively, and A is equal to $8\times10^4/\pi(\Omega/m)$, wherein the electromagnetic wave absorbing body is configured to attenuate electromagnetic waves whose frequency is higher than or equal to 1 GHz and lower than or equal to 100 GHz, and wherein a direction of the electromagnetic waves, to be absorbed by the electromagnetic wave absorbing body, is approximately parallel to a sheet surface of the electromagnetic wave absorbing body.

2. The electromagnetic wave absorbing body according to claim 1, wherein α satisfies a relationship: m+⅕≤α≤m+⅘, in which m is an integer that is larger than or equal to 0.

3. The electromagnetic wave absorbing body according to claim 2, wherein m is equal to 0.

4. The electromagnetic wave absorbing body according to claim 1, wherein the thickness d of the electromagnetic wave absorbing body is larger than or equal to 1 μm and smaller than or equal to 20 mm.

5. The electromagnetic wave absorbing body according to claim 1, wherein the particles comprising the soft magnetic material are contained in an amount of 30 vol % or more in the electromagnetic wave absorbing body.

\* \* \* \* \*